United States Patent [19]

Burke et al.

[11] Patent Number: 5,054,050
[45] Date of Patent: Oct. 1, 1991

[54] DROP TESTING IN FIBER TO THE HOME SYSTEMS

[75] Inventors: Michael E. Burke, Rockaway Township, Morris County; Samuel Colodner, Succasunna; Huy T. Luu, Lake Hiawatha; Steven P. Saneski, Somerset, all of N.J.

[73] Assignee: American Telephone & Telegraph Co., New York, N.Y.

[21] Appl. No.: 516,624

[22] Filed: Apr. 30, 1990

[51] Int. Cl.$^5$ .............................................. H04M 3/30
[52] U.S. Cl. ........................................ 379/27; 379/29
[58] Field of Search ..................... 379/23, 22, 26, 27, 379/29

[56] References Cited

U.S. PATENT DOCUMENTS

| 4,196,321 | 4/1980 | Bosik ..................................... 379/27 |
| 4,270,030 | 5/1981 | Brolin et al. . |
| 4,451,916 | 5/1984 | Casper et al. . |

FOREIGN PATENT DOCUMENTS 51-9312  1/1976  Japan .

Primary Examiner—Stafford D. Schreyer

[57] ABSTRACT

Disclosed is a means for testing drop wires in digital loop systems which employ optical fiber up to a distant terminal near the subscriber's premises. A test module is provided at the distant terminal to determine the presence or absence of faults on the wires to the customer premises. The results of the test are transmitted via an optical data link to the remote terminal where the results can be accessed by a loop tester at the central office.

20 Claims, 7 Drawing Sheets

DROP TESTING IN FIBER TO THE HOME SYSTEMS

BACKGROUND OF THE INVENTION

The invention relates to digital loop transmission systems employing optical fibers, and in particular to a means for testing wire pairs which extend beyond the last fiber link into subscriber premises.

Optical fiber has become the medium of choice for sending digital signals between the central office and remote terminals. Recently the telephone service providers have extended the use of fiber optics beyond the remote terminal by setting up distant terminals on or near the subscriber premises and connecting these distant terminals to the remote terminal by a fiber optic link. The distant terminal converts the digital signals from the fiber into normal analog signals. Beyond the distant terminals, wire pairs, or "drop" wires extend into the customer premises to provide service. While a fiber optic link between remote and distant terminals will greatly increase the information capacity to the subscriber, it also creates a problem in that it eliminates electrical access to the customer's wire pair for determination of fault conditions.

The present method for electrical testing of the subscriber's line utilizes a wire pair extending between the central office and remote terminal which can by-pass the digital link when testing is required (see, for example, U.S. Pat. No. 4,270,030 issued to S. J. Brolin, et al). This technique is acceptable where thousands of customers are being serviced, as is usually the case between the central office and remote terminals. However, it becomes prohibitively expensive to provide wire pairs along with each fiber out to the distant terminals.

It is, therefore, an object of the invention to provide a means for testing the wire pair to customer premises in systems employing optical fiber up to the distant terminal.

SUMMARY OF THE INVENTION

This and other objects are achieved in accordance with the invention which, in one aspect, is a digital loop transmission system comprising a central office terminal, a remote terminal optically and electrically coupled to the central office terminal, and a distant terminal which is optically coupled to the remote terminal. The system further includes means in the distant terminal for testing electrical wires extending beyond the distant terminal and for optically transmitting the results of said test to the remote terminal. The remote terminal further comprises means for converting said results into characteristic resistances which can be electrically accessed by said central office terminal.

In accordance with a further aspect, the invention is a circuit for electrically testing a pair of wires. Circuit means are provided for generating a constant current having at least two values. Also provided is a bridge circuit having two legs and including means for comparing voltages at the two legs of the circuit. The circuit further includes means for coupling at least one of the wires to a leg of the bridge circuit.

BRIEF DESCRIPTION OF THE DRAWING

These and other features of the invention are delineated in detail in the following description. In the drawing.

DETAILED DESCRIPTION

Figure 1:
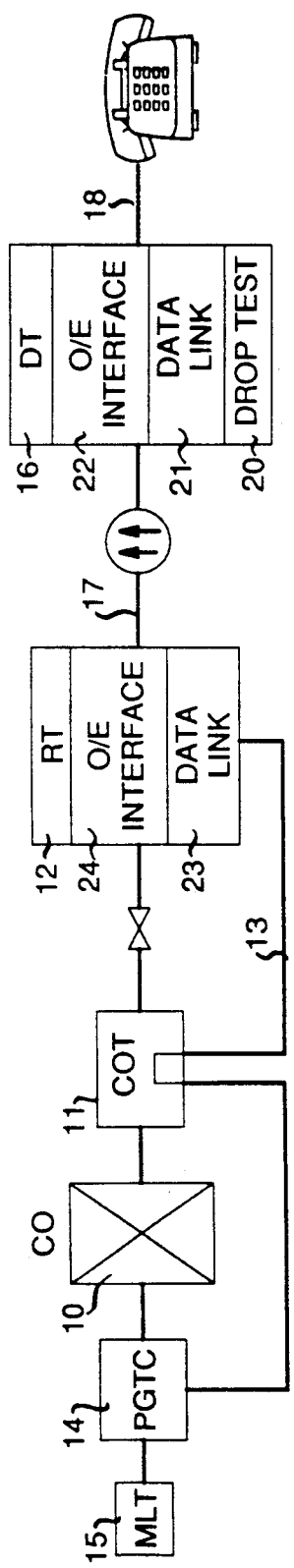
FIG. 1 is a schematic block diagram illustrating a digital loop transmission system in accordance with an embodiment of the invention.

FIG. 1 illustrates in block diagram form a basic digital loop transmission system in accordance with an aspect of the invention. A central office includes a central office switch 10 and a terminal 11 which is optically and electrically coupled to a remote terminal 12 for providing bidirectional digital transmission. The digital signals are usually carried by optical fibers, but a wire pair 13 is also included between the terminals providing an electrical by-pass for the purpose of testing. This wire pair is coupled to a pair gain test controller 14 which is controlled by a mechanized loop tester (MLT) 15. (For more details concerning the pair gain test control arrangement, see U.S. Pat. No. 4,270,030 issued to Brolin, et al, which is incorporated by reference herein.) An optical link 17 connects the remote terminal to a distant terminal 16 which is coupled to a plurality of subscribers by wire pairs, only one of which is illustrated as 18.

In accordance with a main feature of the invention, a drop test module 20 is included as a plug-in circuit card at the distant terminal. This circuit, as described in more detail below, is designed to test the wire pairs, e.g. 18, to the various subscribers, and transmit the results in the form of optical data bits through the distant terminal by means of a data link 21 and an optical/electronic interface 22 back to the remote terminal. The remote terminal includes an O/E interface 24 and data link 23 for receiving the signals and a plurality of resistors which can be coupled to the tip and ring conductors of the wire pair 13 by means of relays which are responsive to the data bits from the distant terminal. The MLT 15 thereby has electrical access to the results of the drop wire testing in the form of these resistors.

Figure 2:
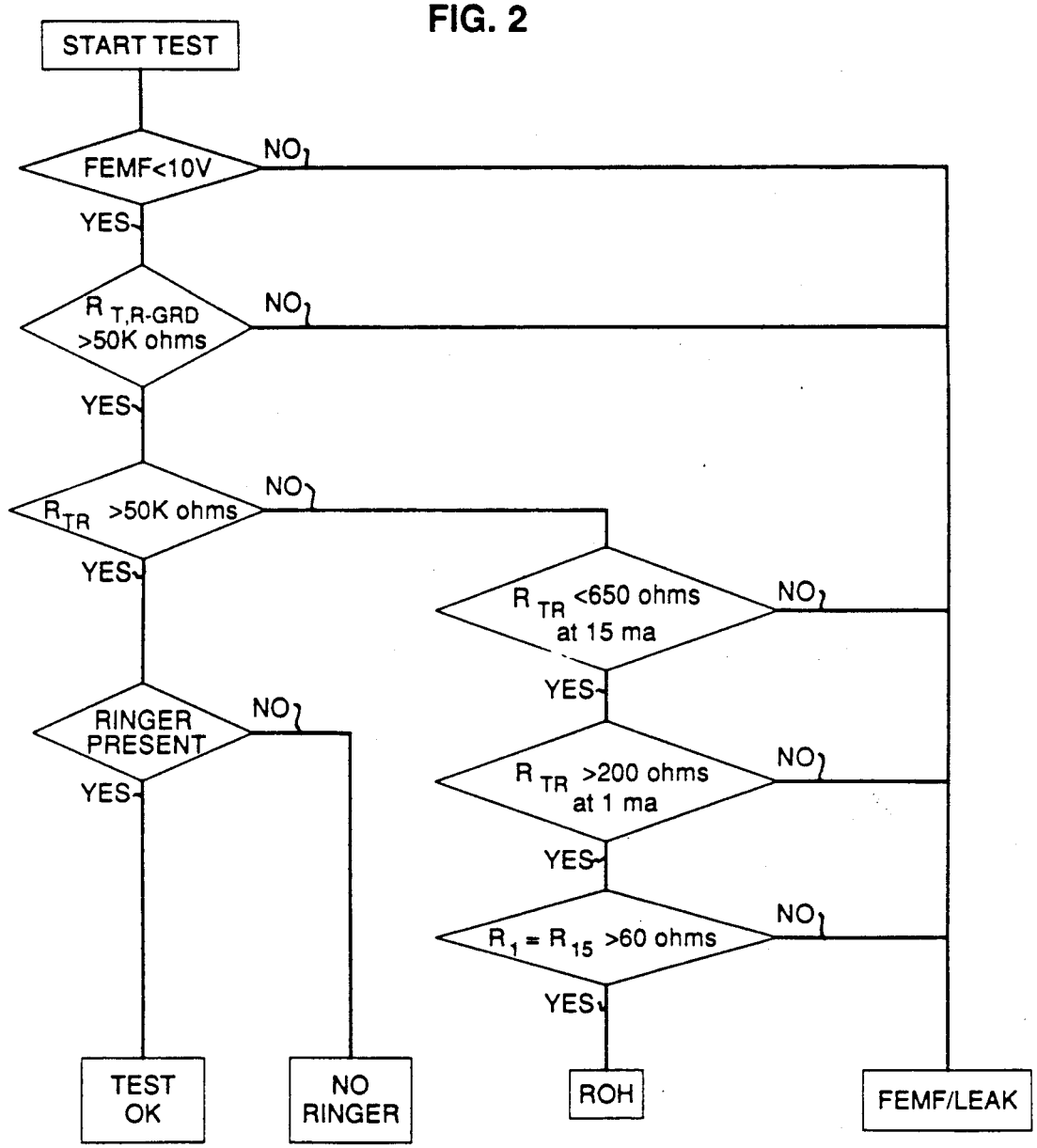
FIG. 2 is a flow diagram illustrating a testing sequence in accordance with an embodiment of the invention.

FIG. 2 illustrates a typical testing sequence performed by the drop test module 20. The first test (designated FEMF) determines the extent of any voltage on the line when the distant terminal is disconnected (also known as "foreign voltage"). If there is a voltage, typically, of at least 10 volts, the wires fail and no more testing is conducted. If the wires pass that test, they are then tested for any leakage in the wires resulting from faults. This is accomplished in the next step of the diagram by coupling the tip and ring conductors of the wire pair together and determining if the combined resistance from the tip and ring conductors to ground is greater than 50K $\Omega$. If it is not, the wires fail this first leakage test and the testing is terminated. If the wires pass the test ($R_{T,R\text{-}GRD} > 50K\ \Omega$), the wires are subjected to a second leakage test in step three of the diagram. Here, the tip conductor is coupled to ground and the resistance from ring-to-tip is measured. If this resistance is, again, greater than 50K $\Omega$, the wires pass and the next test is performed. This test, also known as a "continuity test" determines if the ringer in the customer's telephone is connected by measuring the capacitance of the customer's ringer. If the ringer is connected, the wires pass all tests; if not, the wire fail and an indication of "no ringer" is given. Going back to step 3, if the resistance is not greater than 50K $\Omega$, the wires must be tested further to determine if there is, in fact, a leak or if the customer's receiver is off-hook. These tests are illustrated in the right-hand leg of the diagram. Thus, in the next test, with the tip conductor again grounded, resistance is measured with a 15 milliamp current applied. If the measured resistance is not less than 650 $\Omega$, the wires fail the leak test since the receiver could not exhibit this resitance if the receiver were off-hook. If the resistance is less than 650 $\Omega$, the resistance of ring-to-tip is again measured, since there still might be an off-hook condition, but this time with 1 milliamp of current through the wires. If the resistance is not greater than 200 $\Omega$, the wires fail the leak test since, again, there cannot be an off-hook condition exhibiting this resistance. If the resistance is greater than 200 $\Omega$, the wires are tested one more time to determine if the resistance at 1 milliamp is more than 60 $\Omega$ greater than the resistance at 15 milliamps. If it is, the receiver is off-hook. If it is not, the receiver cannot be off-hook and so there must be leakage which would result in the wires failing the test. This concludes the testing procedure.

Figure 3:
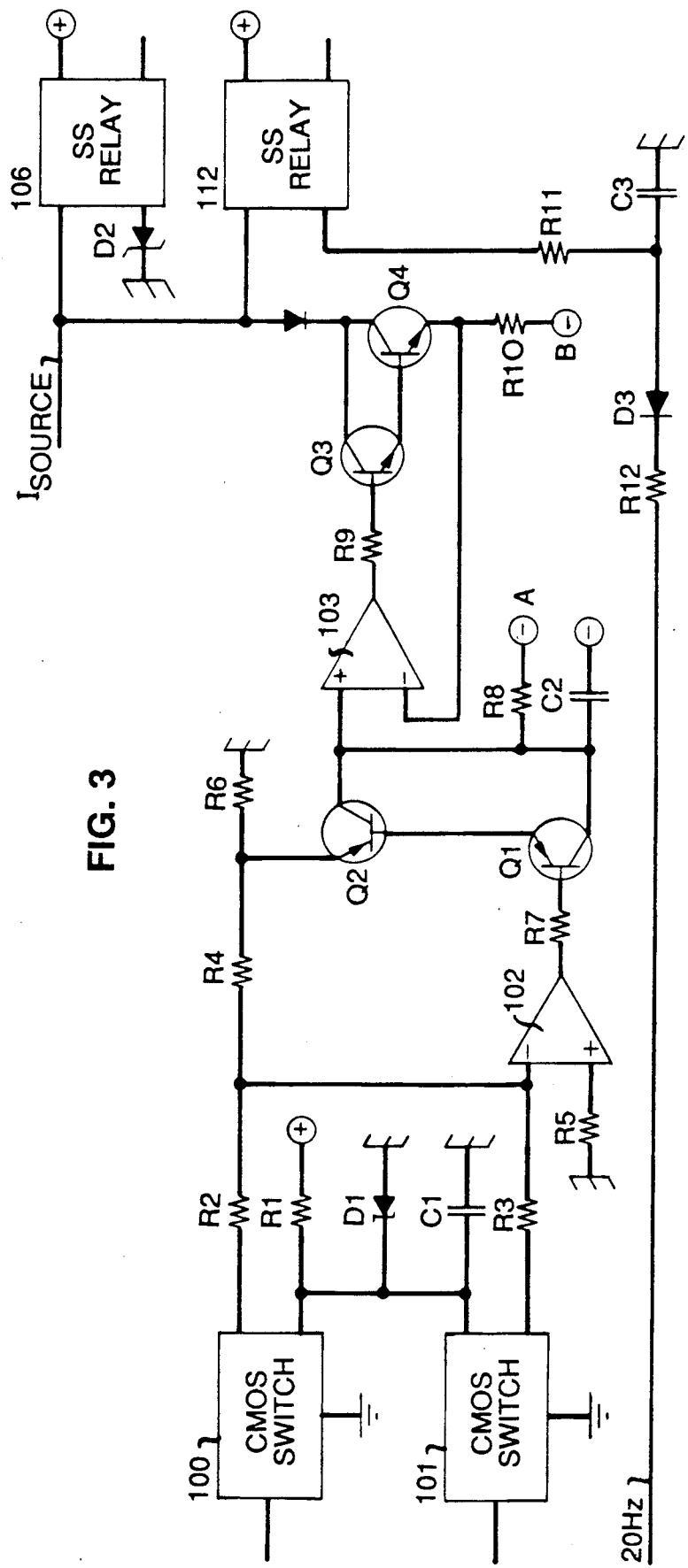
FIGS. 3-5 are schematic diagrams of a circuit for testing drop wires in accordance with an embodiment of the invention.
Figure 4:
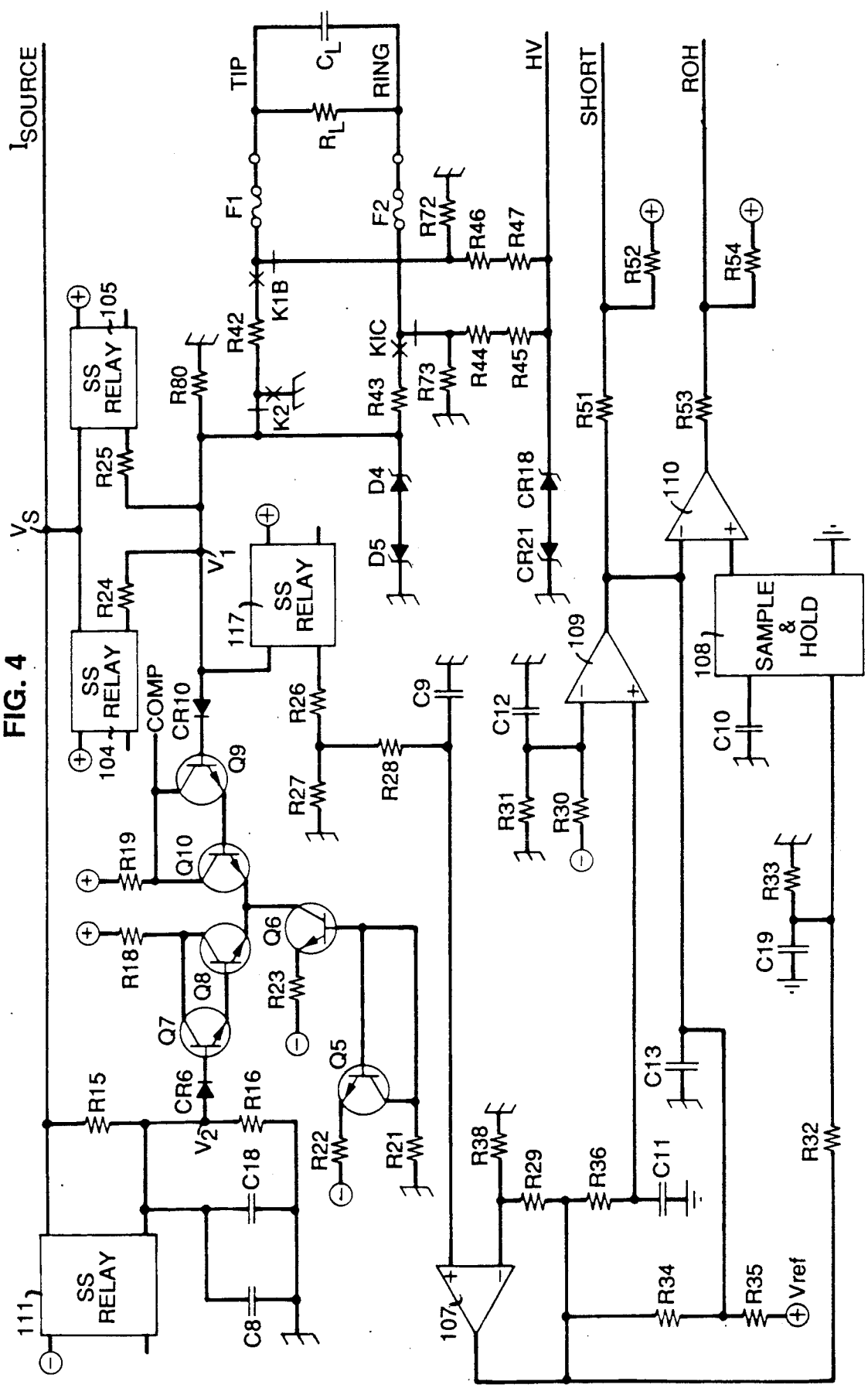
Figure 5:
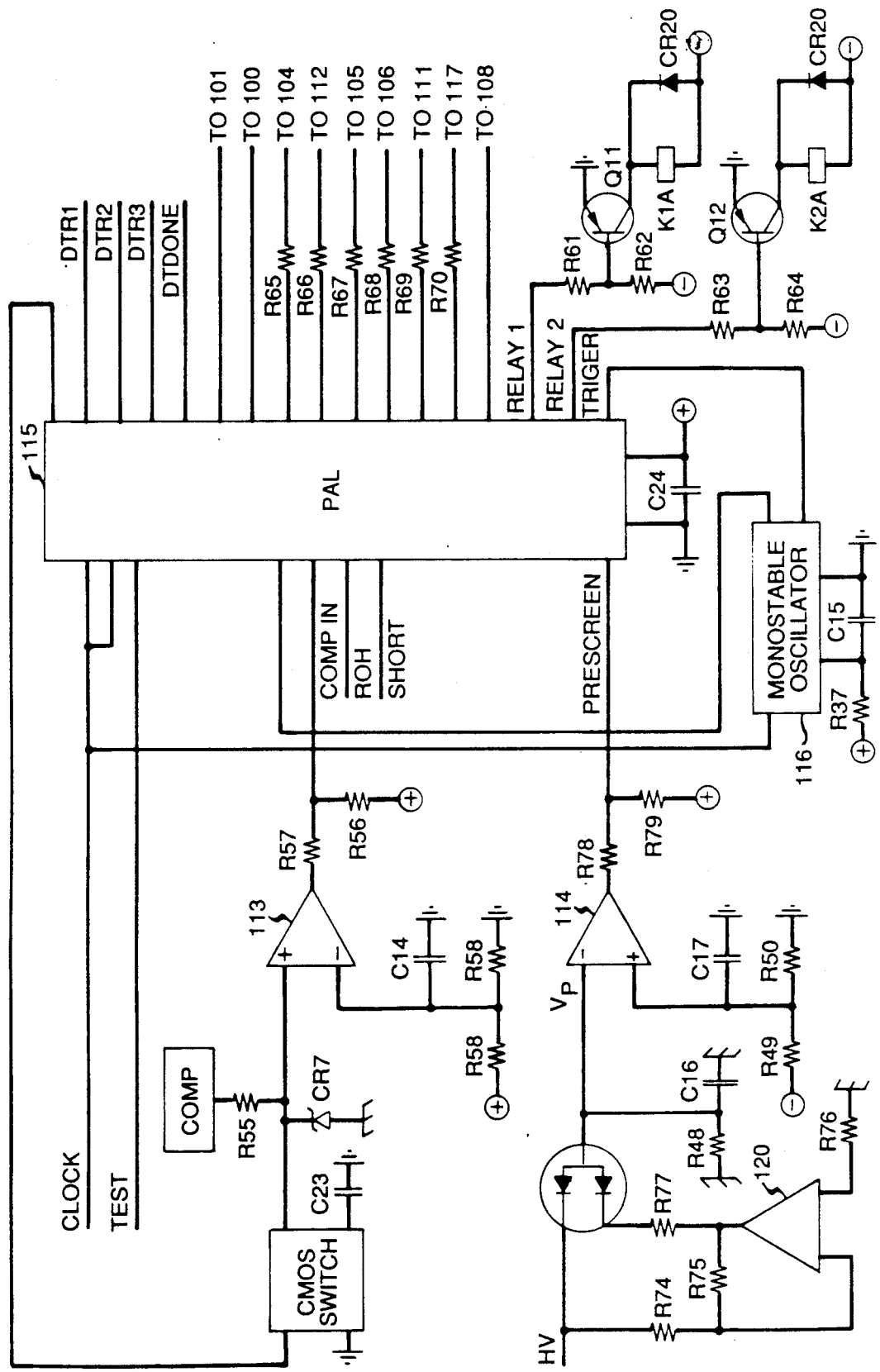

One example of a circuit which is capable of performing these tests is shown in FIGS. 3–5. FIG. 3 essentially illustrates the driver section of the circuit. CMOS switches 100 and 101 will alternatively be enabled to sink either a 1 milliamp or 15 milliamp current, respectively, from the tip and ring conductors. The outputs of the switches provide a 2.5 volt reference voltage (generated across diode $D_1$) across resistors $R_2$ and $R_3$ to the inverting input of an operational amplifier 102. The non-inverting input of the Op Amp is grounded. The feedback loop of the Op Amp includes resistors $R_7$, $R_6$ and $R_4$ as well as a pair of Darlington-coupled bipolar transistors, $Q_1$ and $Q_2$. In order to drive the voltage at the inverting input of the Op Amp to zero volts, a current is drawn through resistor $R_6$ and the transistors $Q_1$ and $Q_2$. This current is supplied through resistor $R_8$ to point A of the circuit which has a voltage of $-30$ volts applied thereto.

A reference current of 0.1 milliamp or 1.5 milliamps is thereby created depending upon which of switches 100 or 101 is enabled. Applying this current to $R_8$ activates a ×10 current mirror formed by Op Amp 103, resistor $R_9$ and Darlington-coupled bipolar transistors $Q_3$ and $Q_4$. This produces the desired 1 milliamp or 15 milliamps current from the conductor labeled Isource through resistor $R_{10}$ to point B which is at $-30$ volts.

As shown in FIG. 4, the drawing of a constant current at the conductor Isource will establish a voltage $V_S$ at one node of a bridge circuit where resistors $R_{15}$ and $R_{16}$ constitute one leg. The other leg is formed by either $R_{24}$ or $R_{25}$, depending upon which of solid state relays 104 or 105 is enabled, and the load resistance, $R_L$, formed by the customer equipment on the conductors labeled Tip and Ring. The tip conductor is coupled to the node connecting $R_{24}$ and $R_{25}$ (labeled $V_1$) through a fuse $F_1$, a relay contact $K_{1B}$, a resistor $R_{42}$ and another relay contact $K_2$. The ring conductor is coupled to the node through fuse $F_2$, relay contact $K_{1C}$ and resistor $R_{43}$. The voltage $V_1$ at this node is compared with the voltage $V_2$ at the node coupling $R_{15}$ and $R_{16}$ by means of a differential amplifier including Darlington-coupled bipolar transistors $Q_7$ and $Q_8$ and resistor $R_{18}$ in one leg, and Darlington-coupled bipolar transistors $Q_9$ and $Q_{10}$ and resistor $R_{19}$ in another leg. The output of this differential amplifier appears as a high or low voltage on the conductor labeled "COMP". A constant current is drawn through the amplifier by a constant current source including bipolar transistors $Q_5$ and $Q_6$ having their base regions coupled in common to resistor $R_{21}$ and their emitters coupled to voltages of $-30$ volts through resistors $R_{22}$ (for $Q_5$) and $R_{23}$ (for $Q_6$).

In order to conduct the foreign voltage test (FEMF $< 10$ V), referring to FIG. 3, a 1 milliamp current is established at Isource by activating switch 100. Also, relay 106 is enabled to connect a 20 volt zener diode, $D_2$, to the same conductor. Returning to FIG. 4, this establishes a $V_S$ on the conductor Isource of $-20$ volts. With switches 104 and 105 both disabled, $V_2$ will be equal to $-10$ volts since $R_{15}$ and $R_{16}$ are equal. The tip and ring conductors are tied together by closing relay contacts $K_{1B}$ and $K_{1C}$ and opening relay contact $K_2$. The voltage $V_1$ on the tip and ring conductors is compared with the voltage $V_2$ of $-10$ volts by the differential amplifier including transistors $Q_7$–$Q_{10}$ as previously described. If $V_1 < -10$ volts, current in the differential amplifier will flow through the $Q_7$–$Q_8$ leg and the output at the COMP conductor will be high, while if $V_1 \geq -10$ volts, the current will flow through $Q_9$–$Q_{10}$ and the output will be low.

The next few leakage tests can also be performed by basically the same portion of the circuit described so far. Thus, in the first leakage test shown in FIG. 2 ($R_{T,R\text{-}GRD} > 50K\ \Omega$), tip and ring conductors are again tied together by closing relay contacts $K_{1B}$ and $K_{1C}$ and opening relay contact $K_2$. Switch 100 (of FIG. 3) is enabled to generate a 1 milliamp current, while swtich 106 (of FIG. 3) is disabled and switch 104 is enabled in order to connect $R_{24}$, which is approximately 50K $\Omega$, to the tip and ring conductors. Therefore, the voltage $V_1$ will be greater than or equal to $V_2$ if the resistance of the subscriber's line, $R_L$, is less than or equal to 50K $\Omega$, and, conversely, $V_1$ will be less than $V_2$ if the subscriber's line resistance, $R_L$, is greater than 50K $\Omega$. As before, if $V_1 < V_2$, current in the differential amplifier will flow through $Q_7$–$Q_8$ and the output at COMP will be high, while if $V_1 \geq V_2$, the current will flow through $Q_9$–$Q_{10}$ and the output will be low. For the second leakage test ($R_{TR} > 50K\ \Omega$), the procedure is the same except that relay contact $K_2$ is closed so that the tip conductor is grounded.

For the next leakage test ($R_{TR} < 650\ \Omega$), switch 101 of FIG. 3 is enabled to produce a constant current of 15 milliamps at Isource. Switch 105 (FIG. 4) is also enabled and switch 104 disabled so that new resistor $R_{25}$ is coupled to the ring conductor (while tip remains grounded by relay contact $K_2$). Since $R_{25}$ is approximately 650 $\Omega$, the output appearing at COMP, which compares the two voltages $V_1$ and $V_2$ as previously described, will indicate whether the resistance on the subscriber's line is greater than or less than 650 $\Omega$.

For purposes of later testing, the voltage $V_1$ appearing when $R_{25}$ is coupled to tip and ring is coupled to an input of Op Amp 107 by enabling switch 117. The output of Op Amp 107 is coupled to a sample and hold integrated circuit 108 after being divided (by 15 in this case) by the resistors $R_{32}$ and $R_{33}$. The resulting voltage is stored on capacitor $C_{10}$ for later use.

For the next leakage test ($R_{TR} > 200\ \Omega$), the current at Isource is returned to 1 milliamp and $R_{25}$ continues to be coupled to the tip and ring conductors. The resulting voltage $V_1$ is still coupled by switch 117 to Op Amp 107, but the output of the Op Amp is also connected to the non-inverting input of comparator 109. The comparator compares this input with the ratio of resistors $R_{30}$ to $R_{31}$, which in this example is approximately 8.7. With $R_{30}$ and $R_{31}$ coupled to a voltage of $-5$ volts, the comparator will produce a signal on the conductor labeled "short" if $R_L$ is less than or equal to 200 ohms, while no signal will be produced if $R_L$ is greater than 200 $\Omega$.

The last leakage test ($R_1$-$R_{15} > 60\ \Omega$) is conducted by comparing this output of Op Amp 107 with the voltage stored in capacitor $C_{10}$ from the previous leakage test which was conducted at 15 millimaps ($R_{TR} > 650\ \Omega$). A reference voltage of $+2.5$ volts applied to resistor $R_{35}$ subtracts from the output of 107 the equivalent of 60 $\Omega$ of resistance. The resulting signal is then applied to the inverting input of comparator 110, while the voltage stored in capacitor $C_{10}$ is applied to the non-inverting input through the sample and hold circuit 108. If the signal at the inverting ($-$) input is less than that at the non-inverting ($+$) input, a signal will appear at the conductor labeled ROH to indicate the receiver is off-hook. If the signal at the inverting input is greater than or equal to that at the non-inverting input, no signal will appear at ROH, thus indicating that the problem was a leak.

The test for the presence of a ringer on the customer's line is made by measuring the capacitance between tip and ring. This test makes use of the high voltage which is derived by taking the ringing supply (an AC signal of approximately 20 Hz which is continuously applied to the conductor "20 Hz" of FIG. 3) and rectifying it by diode $D_3$ to store a voltage of approximately $-120$ volts on capacitor $C_3$. This voltage is discharged onto Isource by enabling switch 112 while the energy delivered to the load is restricted by $R_{11}$ to prevent the telephone from accidentally ringing. This voltage charges the capacitance, $C_R$, on the customer's line (FIG. 4) through resistor $R_{25}$ by activating switch 105. Zener diodes $D_4$ and $D_5$ limit the voltage stored on the line to $-75$ volts. The large voltage used ($-75$ V) allows sufficient charge to be stored on electronic ringers that have zener diodes in series with the capacitor. At the same time, reference capacitors $C_{18}$ and $C_8$ are also charged to the same voltage $V_S$ by enabling switch 111. When switches 112, 105, and 111 are disabled, the capacitors are disconnected from the voltage $V_S$. Enabling switch 117 causes the ringer capacitance, $C_R$, to discharge through resistors $R_{26}$ and $R_{27}$ which have a combined resistance of approximately 50K $\Omega$. At the same time, reference capacitors $C_{18}$ and $C_8$ will discharge through resistor $R_{16}$ which is also equal to approximately 50K $\Omega$. After a specified interval, usually approximately 10 milliseconds, the voltages $V_1$ and $V_2$ are compared by the comparator element as previously described. If $V_1$ is greater than $V_2$, there is a ringer on the line.

It is also desirable in a testing circuit of this type to insure that there are no excessive AC or positive voltages on the tip and ring conductors which could damage the components of the circuit. Thus, the circuit also provides a means for pre-screening the tip and ring conductors for high voltage prior to the series of tests previously described. This pre-screening is accomplished by routing the tip and ring conductors through relay contacts $K_{1B}$ and $K_{1C}$ of FIG. 4 and resistors $R_{46}$, $R_{47}$, and $R_{44}$, $R_{45}$ to conductor HV. Any positive voltage on HV will be inverted to a negative voltage by inverter 120 of FIG. 5. As also shown in FIG. 5, the peak value of any AC signal or the DC signal will appear as a negative voltage $V_p$ applied to the inverting ($-$) input of comparator 114. This voltage, $V_p$, gets compared with the voltage at the non-inverting ($+$) input produced by resistors $R_{49}$ and $R_{50}$ coupled to a source of $-5$ volts. Thus, if the absolute magnitude of the voltage on tip and ring is greater than 10 volts, the output of comparator 114 produces a flag (PRE-SCREEN) at the programmable array logic (PAL) chip 115 and the testing will be terminated.

As further shown in FIG. 5, the signal on the COMP conductor from the previously-described tests utilizing the comparator including $Q_7$–$Q_{10}$ of FIG. 4 is coupled to comparator 113 to provide gain and convert to a logic level signal on conductor COMP IN which can be utilized by the PAL 115. That signal as well as the signals previously described which are produced on the ROH, PRESCREEN, and SHORT conductors are all applied to the input portion of the PAL 115. The test results appear as one bit on each of the output leads DTR1, DTR2, and DTR3. The conductor DT DONE indicates when a test is completed. The remainder of the output conductors are each coupled to one of the switches of the circuit as indicated. The conductors labeled Relay 1 and Relay 2 operate, respectively, the relay contacts $K_{1A}$ and $K_{2A}$ which are associated, respectively, with the relay contacts $K_{1B}$, $K_{1C}$, and $K_2$ of FIG. 4. A monostable oscillator 116 is also coupled to the PAL to adjust the normal clocking of the PAL during the ringer test to produce the 10 millisec period for sampling the discharging capacitance.

Figure 6:
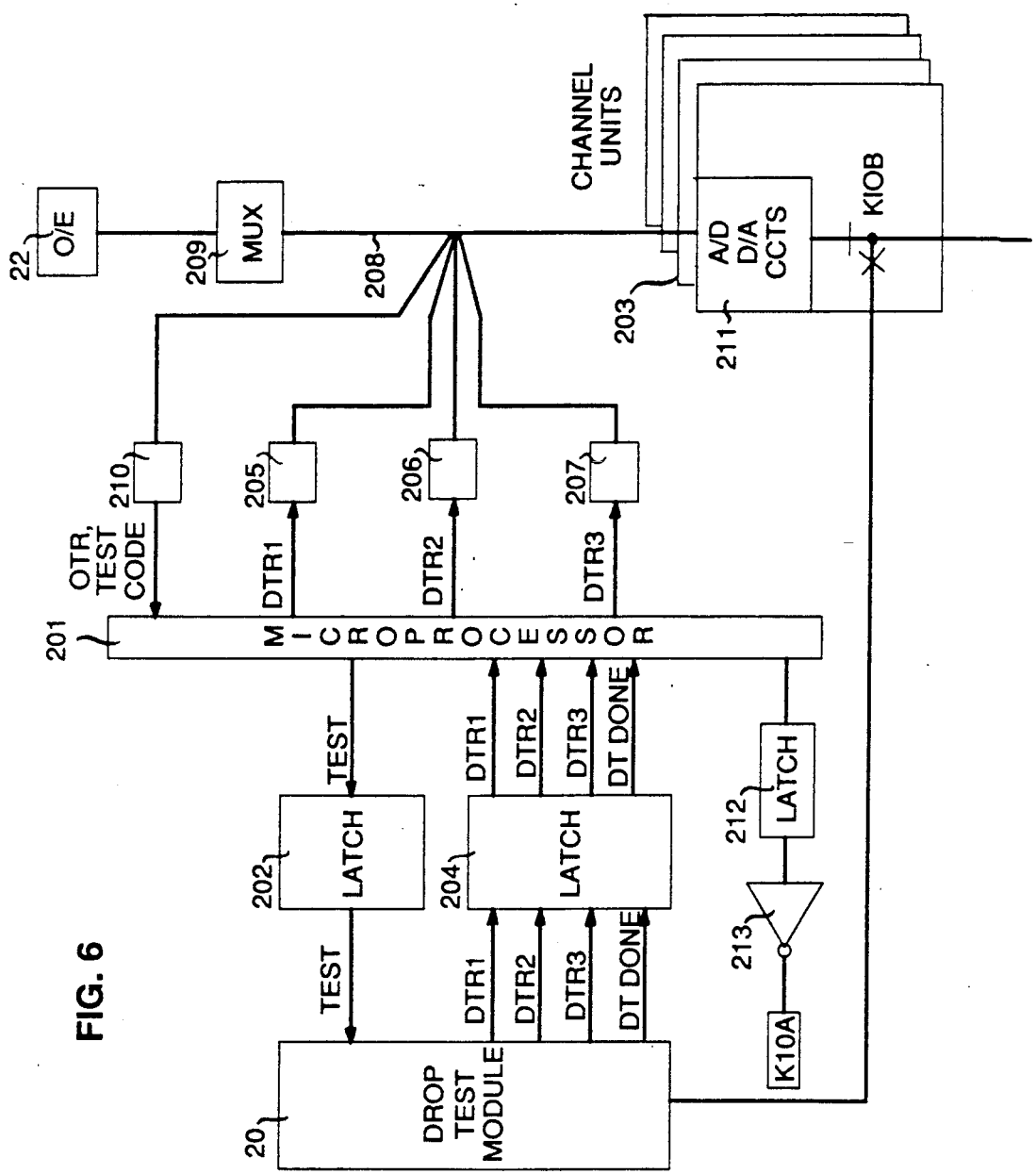
FIG. 6 is a schematic block diagram of a circuit for transmitting test signals in accordance with an embodiment of the invention.

The outputs from the PAL 115 are then coupled to the data link, 21 of FIG. 1, at the distant terminal. This data link is illustrated in more detail in the block diagram of FIG. 6. As shown, the drop test module 20 is controlled by a microprocessor 201 which initiates testing by providing a signal on the TEST lead through a latch 202 after receiving a command (test code) from the central office as part of the normal digital stream on data bus 208. This command, along with a confirmatory signal (OTR) from the remote terminal, is coupled to the microprocessor 201 through latch 210 and specifies which of the channel units 203 are to be tested. The test module is coupled to the drop wires through the channel unit 203 serving the subscriber when a relay $K_{10A}$ is operated to close contact $K_{10B}$. This relay is operated when microprocessor 201 sends a signal through latch 212 and relay driver 213 which is coupled to the relay. (It will be appreciated that only one relay driver and relay are shown, but there typically would be one of each for every channel unit.) The test results from the module are transmitted as separate bits on leads DTR1, DTR2 and DTR3 to the microprocessor 201 through a latch 204. The test bits are then transmitted along with other data to separate latches 205, 206 and 207 onto the data bus 208. A multiplexer 209 frames the data bits and scrambles the signal according to well-known techniques. The signal is then coupled to a standard optical/electronic interface 22, which comprises a laser and photodetector, for optical transmission to the remote terminal. The optical data signal is transferred via optical link 17 of FIG. 1 from the distant terminal to the O/E interface 24 and data link 23 of FIG. 1 at the remote terminal.

Figure 7:
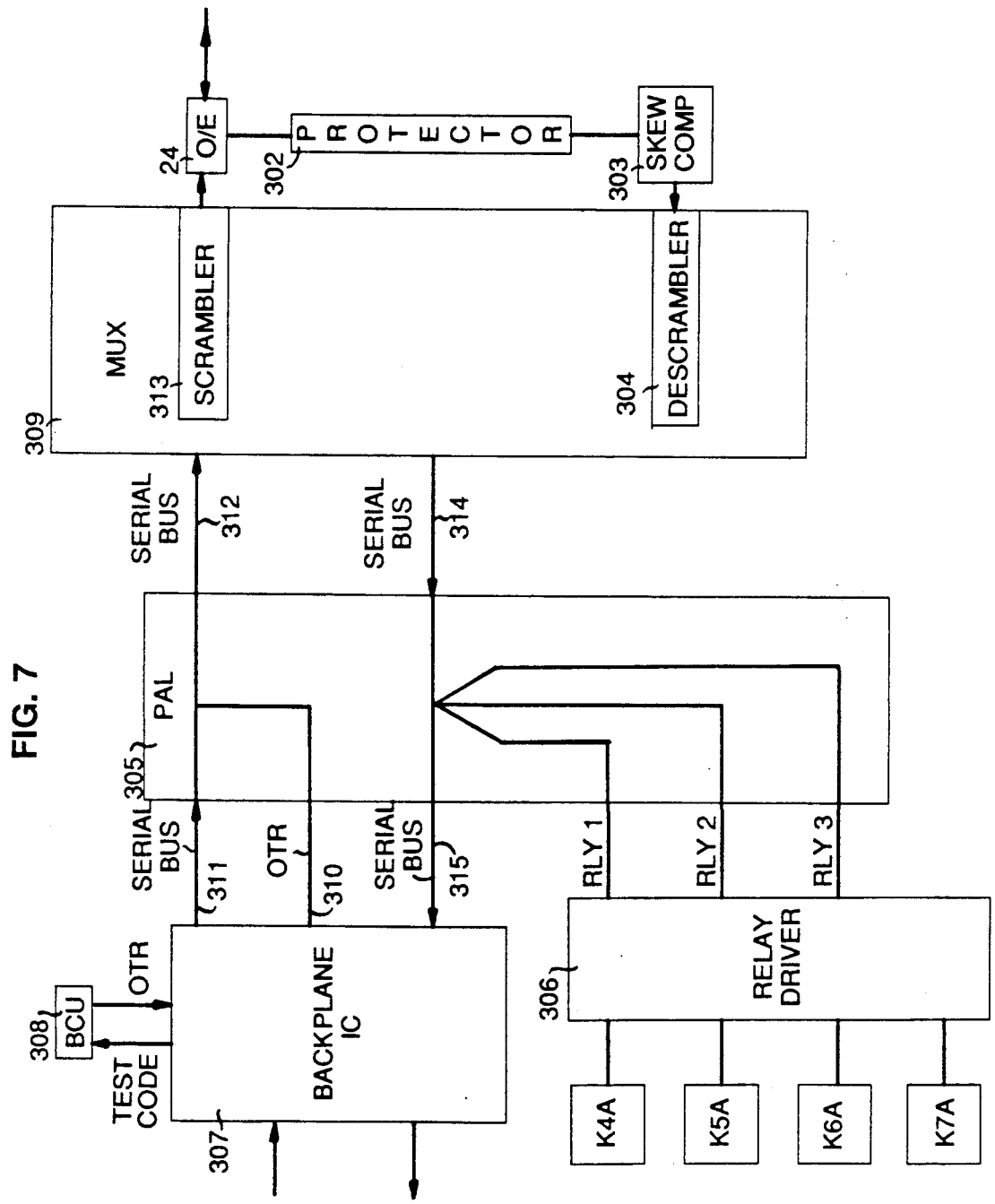
FIG. 7 is a schematic block diagram of a circuit for receiving test result signals and transmitting test control information in accordance with the same embodiment.

As illustrated in more detail in the block diagram of FIG. 7, the remote terminal converts the optical signal to an electronic signal by means of a standard optical/electronic interface circuit shown as 24. The signals are coupled to a standard protection circuit, illustrated by block 302, and fed to a skew compensator 303 to set the incoming data to the clock (not shown) at the remote terminal. The skew compensator can be the type including a programmable array logic chip which is described in U.S. Pat. No. 4,839,907 issued to S. P. Saneski. The signals are then descrambled by standard means 304, such as a custom IC chip which is part of a multiplexer/demultiplexer 309, and coupled to the input of a programmable array logic chip 305 which picks out the bits related to the drop testing and produces them on the lines labeled RLY1, RLY2 and RLY3. These bits are coupled to a standard relay driver 306 which operates relay contacts $K_{4A}$–$K_{7A}$. These relays operate the contacts $K_{4B}$, $K_{5B}$, $K_{6B}$, $K_{7B}$, $K_{4C}$, $K_{5C}$, $K_{6C}$, and $K_{7C}$ illustrated in FIG. 8. (The first number in the designation of the contact is the same as the first number of the relay to which it corresponds.) FIG. 7 also illustrates the communication path from the remote terminal to the distant terminal. A backplane access circuit 307 decodes and translates digital signals from the central office. This bit stream, which includes a command (test code) from the central office to test a channel unit, is put onto the bus 311 and sent through a programmable array logic chip 305 onto bus 312 to the multiplexer/demultiplexer circuit 309. Part of this circuit includes a scrambling circuit 313. The scrambled signal is coupled to the O/E interface 24 and sent to the distant terminal. Referring back to the backplane circuit 307, the test code is also picked off of the incoming data and sent to a bank controller unit (BCU) 308. The BCU decides if the test should take place. If the test is to proceed, a confirmatory signal (OTR) is sent by the BCU through the backplane circuit onto lead 310 to the PAL where the signal is combined with the rest of the incoming signal on bus 312 for transmission to the distant terminal.

Figure 8:
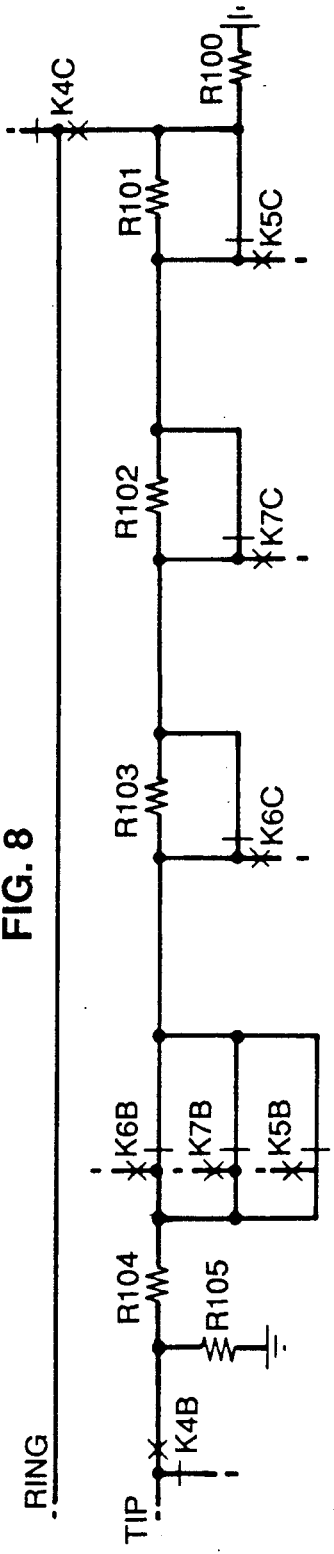
FIG. 8 is a schematic diagram of a circuit for exhibiting resistances in accordance with the same embodiment.

The circuit of FIG. 8 is the remote terminal tip-to-ring resistance delta to the central office based on which contacts are opened or closed by the data from the drop test. Resistors $R_{100}$ and $R_{105}$ produce constant ring-to-ground and tip-to-ground resistance which, in this example is approximately 91K $\Omega$. Resistor $R_{104}$, which in this example is approximately 18K $\Omega$, provides a minimum resistance regardless of the test results. Resistors $R_{101}$, $R_{102}$ and $R_{103}$, which in this example are 40K $\Omega$, 20K $\Omega$, and 10K $\Omega$, respectively, will be coupled between tip and ring or shorted out depending on the condition of switches $K_{5C}$, $K_{7C}$ and $K_{6C}$, respectively, which are normally closed to short out these resistors. The table below gives one example of how the 3-bit messages from the drop test module can indicate various test conditions based on the coupling of the various resistors.

TABLE

| Bit Message | Condition | Switches Opened | Resistors Coupled |
|---|---|---|---|
| 001 | No Drop Test Module | $K_{6C}$ | $R_{104}$ and $R_{103}$ |
| 010 | Pass | $K_{7C}$ | $R_{104}$ and $R_{102}$ |
| 011 | No Ringer | $K_{6C}$ and $K_{7C}$ | $R_{104}$, $R_{103}$, and $R_{102}$ |
| 100 | FEMF/Leakage | $K_{5C}$ | $R_{104}$ and $R_{101}$ |
| 101 | ROH | $K_{6C}$ and $K_{5C}$ | $R_{104}$, $R_{101}$, and $R_{103}$ |

The first condition in the table indicates no drop test module is available. In the event that the optical link between the distant and remote terminals is not working properly, an open circuit will be presented to the central office by opening switches $K_{5B}$, $K_{6B}$, and $K_{7B}$.

It will be appreciated that various values of the circuit components given herein are illustrative and can be varied according to particular needs. Various other additions and modifications will also become apparent to those skilled in the art. All such variations which rely on the teachings through which the invention has advanced the art are properly considered within the scope of the invention.

We claim:

1. A digital loop transmission system comprising:
   a central office terminal;
   a remote terminal optically and electrically coupled to the central office terminal;
   a distant terminal optically coupled to the remote terminal; and
   means in the distant terminal for testing electrical wires extending beyond the distant terminal and for optically transmitting the results of said test to the remote terminal.

2. The system according to claim 1 further comprising means in the remote terminal for converting said results into characteristic resistances which can be electrically accessed by a loop tester.

3. The system according to claim 1 wherein the testing means includes means for detecting leakage in the wires, the presence of a ringer circuit coupled to the wires and an off-hook condition of equipment coupled to the wires.

4. The system according to claim 3 wherein the testing means includes means for generating a constant current of two different values and for determining the resistance of the wires at these values.

5. The system according to claim 1 wherein the testing means includes a bridge circuit for comparing the resistance on the wires with a known resistance.

6. The system according to claim 1 further comprising means for producing a data signal comprising a predetermined bit length in response to said tests and for combining that signal with other data from the distant terminal for transmission to the remote terminal.

7. The system according to claim 1 wherein the characteristic resistances are generated by a resistor delta including fixed resistances between each wire and ground, and a variable resistance between the two wires.

8. The system according to claim 7 wherein the variable resistance is generated by a plurality of resistors coupled in series between the two wires and individual switches coupled in parallel to each of said resistors, said switches being responsive to the signal transmitted by the testing means to electrically couple one or more of said resistors between the two wires.

9. A circuit for electrically testing a pair of wires comprising:
   circuit means for generating a constant current having at least two values;
   a bridge circuit having two legs and including means for comparing voltages at the two legs of the circuit; and
   means for coupling at least one of said wires to a leg of the bridge circuit.

10. The circuit according to claim 9 further comprising switching means for alternatively coupling two resistors to the leg of the bridge circuit coupled to at least one of said wires.

11. The circuit according to claim 9 further comprising means for comparing the voltage across the wires to a predetermined maximum value prior to coupling at least one of said wires to the bridge circuit.

12. The circuit according to claim 9 further comprising means for producing a digital output signal having a predetermined bit length, said signal based at least in part on the output of the comparing means.

13. The circuit according to claim 9 wherein the circuit means for generating a constant current comprises an operational amplifier with one input grounded and the other input coupled to a source of reference voltage, and a feedback loop to said other input comprising a pair of bipolar transistors and a resistor through which a constant current is drawn when said transistors are enabled.

14. The circuit according to claim 13 wherein the source of reference voltage is provided alternatively through a pair of switches having different resistors at the output of the switches.

15. The circuit according to claim 9 wherein the means for comparing voltages comprises a differential amplifier having two legs and including Darlington-coupled bipolar transistors and a resistor in different legs, each leg being coupled to a current source.

16. The circuit according to claim 9 further comprising means for coupling a zener diode of a particular breakdown voltage to a leg of the bridge circuit.

17. The circuit according to claim 10 further comprises means for storing the voltage generated at a leg of the bridge circuit when one of said two resistors is coupled thereto.

18. The circuit according to claim 17 further comprising an operational amplifier with one input coupled through a switch to a leg of the bridge circuit and the other input coupled to a pair of resistors so as to produce a signal if the resistance of the wires is greater than a predetermined value.

19. The circuit according to claim 18 further comprising a comparator element with one input coupled to the output of said operational amplifier and the other input coupled to said voltage storing means.

20. The circuit according to claim 9 further comprising reference capacitors coupled through a switch to a node of said bridge circuit, means for charging said capacitors and any capacitors on the wires to the same voltage, and means for discharging said capacitors and said capacitors on the line so that the amount of charge stored is compared by the comparing means of the bridge circuit.

* * * * *

UNITED STATES PATENT AND TRADEMARK OFFICE
CERTIFICATE OF CORRECTION

PATENT NO. : 5,054,050
DATED : October 1, 1991
INVENTOR(S) : Michael E. Burke, et al It is certified that error appears in the above-indentified patent and that said Letters Patent is hereby corrected as shown below:

On title page, add, Attorney, Agent or Firm; --Lester H. Birnbaum--
Column 3, line 10, "wire fail" should read
--wires fail--; line 59 "Isource" should read --$I_{source}$--; line 62 "Isource" should read --$I_{source}$--. Column 4, line 20, "Isource" should read --$I_{source}$--; line 23, "Isource" should read --$I_{source}$--; line 30, "$Q_{-10}$" should read --$Q_{10}$--; line 34, "$\geqq -10$ volts" should read --$\geq -10$ volts--; line 52, "$\geqq V_2$" should read --$\geq V_2$--; line 59, "Isource" should read --$I_{source}$--; line 60, "new" should read --now--. Column 5, line 7, "Isource" should read --$I_{source}$--; line 22, "millimaps" should read --milliamps--; line 44, "Isource" should read --$I_{source}$--; line 47, "$C_R$" should read --$C_L$--; line 57, "$C_R$" should read --$C_L$--. Column 6, line 36, "relay contacts" should read --relays--. Column 7, line 56, "example is" should read --example, is--.

Signed and Sealed this

Sixteenth Day of November, 1993

*Attest:*

BRUCE LEHMAN

*Attesting Officer*  Commissioner of Patents and Trademarks